(12) United States Patent
Choi et al.

(10) Patent No.: US 11,532,336 B2
(45) Date of Patent: Dec. 20, 2022

(54) MEMORY DEVICE FOR PROCESSING A ROW-HAMMER REFRESH OPERATION AND A METHOD OF OPERATING THEREOF

(71) Applicant: SAMSUNG ELECTRONICS CO., LTD., Suwon-si (KR)

(72) Inventors: Hyojin Choi, Seoul (KR); Jaewon Ko, Suwon-si (KR); Hyeongtae Kim, Hwaseong-si (KR); Younsik Park, Hwaseong-si (KR); Hyeonsik Son, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 9 days.

(21) Appl. No.: 17/340,423

(22) Filed: Jun. 7, 2021

(65) Prior Publication Data
US 2022/0084564 A1    Mar. 17, 2022

(30) Foreign Application Priority Data
Sep. 16, 2020  (KR) .......................... 10-2020-0119313

(51) Int. Cl.
*G11C 7/00*    (2006.01)
*G11C 7/10*    (2006.01)
(Continued)

(52) U.S. Cl.
CPC .......... *G11C 7/1012* (2013.01); *G11C 7/1036* (2013.01); *G11C 11/4082* (2013.01); *G11C 29/783* (2013.01)

(58) Field of Classification Search
CPC .............. G11C 11/4082; G11C 11/406; G11C 11/4076; G11C 11/4087; G11C 29/783;
(Continued)

(56) References Cited

U.S. PATENT DOCUMENTS 9,251,885 B2    2/2016  Greenfield et al.
9,299,400 B2    3/2016  Bains et al.
(Continued)

OTHER PUBLICATIONS

European Search Report issued in corresponding EP Patent Application No. 21197253.4 dated Mar. 3, 2022.

*Primary Examiner* — Thong Q Le
(74) *Attorney, Agent, or Firm* — F. Chau & Associates, LLC

(57) ABSTRACT

A memory device including: a memory cell array including a plurality of memory cell rows; an address buffer configured to store addresses of target rows of the plurality of memory cell rows, wherein the addresses of the target rows have been repeatedly accessed; a minimum access output circuit configured to select, when there are a plurality of rows having a same minimum access count among the target rows, any one of the plurality of rows having the same minimum access count as a minimum access row based on a selection command value, and to output an index value of the minimum access row; and a control circuit configured to output a command instructing replacement of an address corresponding to the index value of the minimum access row with an address of an access row and storage of the address of the access row in the address buffer.

20 Claims, 14 Drawing Sheets

(51) Int. Cl.
*G11C 11/408* (2006.01)
*G11C 29/00* (2006.01)

(58) Field of Classification Search
CPC ............. G11C 7/1012; G11C 7/1036; G11C
11/40611; G11C 11/40622; G11C
11/40626; G11C 16/08; G11C 16/3427;
G11C 7/22; G11C 8/12; G11C 7/106;
G11C 7/1087; G11C 7/12; G11C 7/20;
G11C 8/08; G11C 8/10; G11C 7/1072;
G11C 7/222; G11C 11/1653; G11C
11/401; G11C 11/40618; G11C 11/4063;
G11C 11/407; G11C 11/408; G11C
13/0028; G11C 13/0061; G11C 13/0064;
G11C 13/0069; G11C 13/0097; G11C
2207/2272; G11C 2207/2281; G11C 5/04;
G11C 7/04; G11C 7/1018; G11C 7/1045;
G11C 7/1066; G11C 7/225; G11C 8/04;
G11C 13/0007
See application file for complete search history.

(56) References Cited

U.S. PATENT DOCUMENTS

| | | | |
|---|---|---|---|
| 9,690,505 | B2 | 6/2017 | Benedict |
| 9,978,440 | B2 | 5/2018 | Cho |
| 10,446,216 | B2 | 10/2019 | Oh et al. |
| 2014/0156923 | A1 | 6/2014 | Bains et al. |
| 2015/0213872 | A1 | 7/2015 | Mazumder et al. |
| 2017/0040050 | A1 | 2/2017 | Chang et al. |
| 2017/0092342 | A1* | 3/2017 | Shigeki ............ G11C 8/08 |
| 2019/0237131 | A1 | 8/2019 | Ito |
| 2020/0005857 | A1 | 1/2020 | Ito et al. |
| 2020/0042197 | A1 | 2/2020 | Kotra et al. |
| 2020/0090729 | A1 | 3/2020 | Son et al. |

\* cited by examiner

FIG. 6A

| INDEX | ADDR | COUNT |
|---|---|---|
| 1 | ADDR1 | 32 |
| 2 | ADDR2 | 8 |
| 3 | ADDR3 | 4 |
| 4 | ADDR4 | 5 |
| 5 | ADDR5 | 4 |
| 6 | ADDR6 | 4 |
| 7 | ADDR7 | 6 |
| 8 | ADDR8 | 7 |

FIG. 6B

| INDEX | COUNT |
|---|---|
| 2 | 8 |
| 3 | 4 |
| 5 or 6 | 4 |
| 7 | 6 |

FIG. 6C

| INDEX | COUNT |
|---|---|
| 3 | 4 |
| 5 or 6 | 4 |

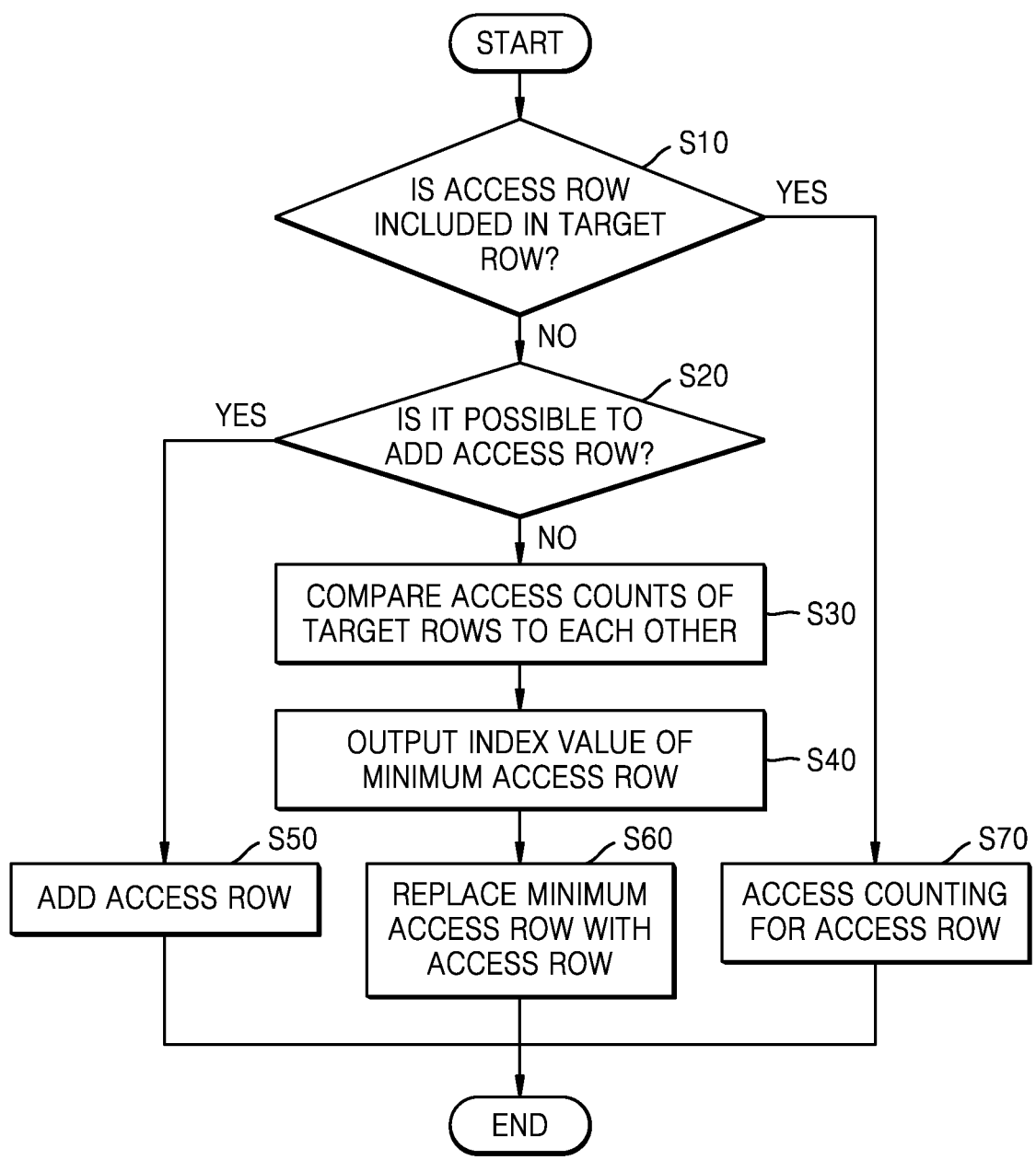

MEMORY DEVICE FOR PROCESSING A ROW-HAMMER REFRESH OPERATION AND A METHOD OF OPERATING THEREOF

CROSS-REFERENCE TO RELATED APPLICATION

This application claims priority under 35 U.S.C. § 119 to Korean Patent Application No. 10-2020-0119313, filed on Sep. 16, 2020, in the Korean Intellectual Property Office, the disclosure of which is incorporated by reference herein in its entirety.

TECHNICAL FIELD

The inventive concept relates to a memory device, and more particularly, to a memory device configured to perform a row-hammer refresh operation and an operating method thereof.

DISCUSSION OF RELATED ART

A volatile memory device such as dynamic random access memory (DRAM) determines data by using a current stored in a capacitor. For example, the DRAM stores each bit of data in the capacitor. However, as a current stored in a capacitor may leak over time, the volatile memory device periodically performs a refresh operation. In other words, the data is periodically rewritten in the capacitor. As a manufacturing process of a memory device is scaled down, the space between word lines decreases, and thus, a voltage distribution in one word line may cause an electric charge of a memory cell connected to a word line adjacent to the one word line to increase. When one word line is intensively accessed, a row-hammer phenomenon may occur, in which data stored in memory cells connected to the adjacent word line is lost due to the voltage in an active state of the one word line.

SUMMARY

According to an embodiment of the inventive concept, there is provided a memory device including: a memory cell array comprising a plurality of memory cell rows; an address buffer configured to store addresses of target rows of the plurality of memory cell rows, wherein the addresses of the target rows have been repeatedly accessed; a minimum access output circuit configured to select, when there are a plurality of rows having a same minimum access count among the target rows, any one of the plurality of rows having the same minimum access count as a minimum access row based on a selection command value, and to output an index value of the minimum access row; and a control circuit configured to output a command instructing replacement of an address corresponding to the index value of the minimum access row with an address of an access row and storage of the address of the access row in the address buffer.

According to an embodiment of the inventive concept, there is provided a memory controller including: an address storage circuit configured to store addresses of target rows that are repeatedly accessed among a plurality of rows included in a memory device; a minimum access output circuit configured to select, when there are a plurality of minimum access rows having a same minimum access count among the target rows, any one of the plurality of minimum access rows having the same minimum access count as a minimum access row based on a selection command value, and to output an index value of the minimum access row; and a control circuit configured to output a command to replace an address corresponding to the index value of the minimum access row with an address of an access row and store the address of the access row in the address storage circuit.

According to an embodiment of the inventive concept, there is provided a register clock driver buffer device including: an address buffer configured to store addresses of target rows that are repeatedly accessed among a plurality of rows included in a plurality of memory devices; a minimum access output circuit configured to select, when there are a plurality of minimum access rows having a same minimum access count among target rows of a target memory device, any one of the minimum access rows as a minimum access row based on a selection command value, and to output an index value of the minimum access row; and a control circuit configured to output a command instructing replacement of an address corresponding to the index value of the minimum access row in the target memory device with an address of an access row and storage of the address of the access row in the address buffer.

According to an embodiment of the inventive concept, there is provided an operating method of a memory device, the operating method including: comparing access counts of target rows included in the memory device, wherein the targets rows are repeatedly accessed; selecting, when there are a plurality of minimum access rows having a same minimum access count among the target rows, any one of the minimum access rows as a minimum access row based on a selection command value and outputting an index value of the minimum access row; and providing a command to replace an address corresponding to the index value of the minimum access row with an address of an access row and storing the address of the access row in an address buffer.

BRIEF DESCRIPTION OF THE DRAWINGS

Embodiments of the inventive concept will be more clearly understood from the following detailed description taken in conjunction with the accompanying drawings in which:

FIGS. 6A, 6B and 6C each include a table showing an example of outputting an index value of a minimum access row according to an embodiment of the inventive concept;

FIG. 8 is a flowchart of an operating method of a memory device according to an embodiment of the inventive concept;

DETAILED DESCRIPTION OF THE EMBODIMENTS

Hereinafter, embodiments of the inventive concept will be described in detail with reference to the accompanying drawings.

Figure 1:
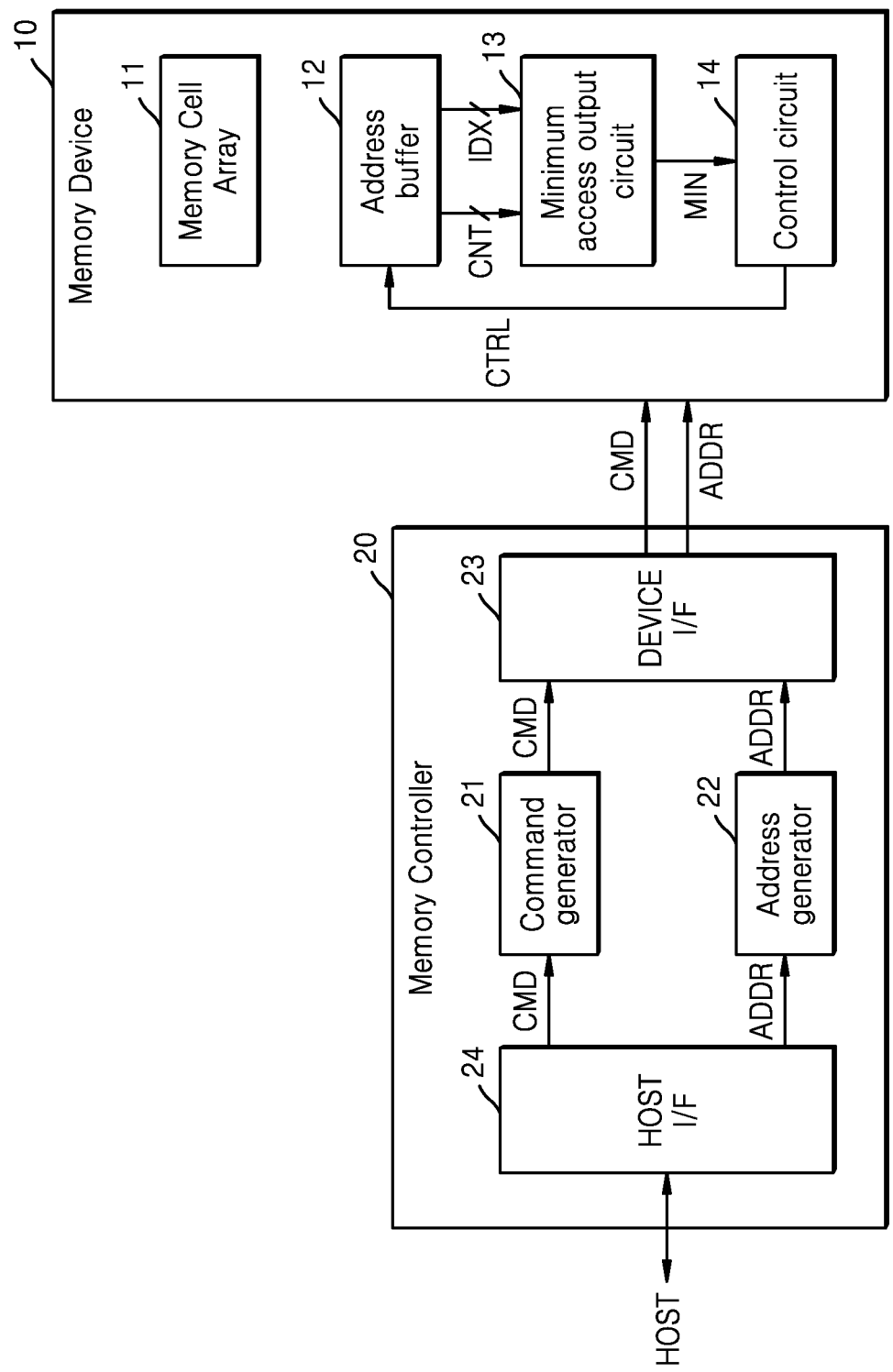
FIG. 1 is a block diagram of a memory system according to an embodiment of the inventive concept.

FIG. 1 is a block diagram of a memory system according to an embodiment of the inventive concept.

Referring to FIG. 1, the memory system may include a memory device 10 and a memory controller 20. The memory controller 20 may transmit/receive data to/from a host device HOST, and may transmit a command CMD and an address ADDR to the memory device 10. The memory controller 20 may include a command generator 21, an address generator 22, a device interface 23, and a host interface 24. The host interface 24 may receive a command CMD and an address ADDR from the host device HOST, and the command generator 21 may generate an access command and a row hammer refresh command by decoding the command CMD received from the host device HOST, and may provide the access command and the row-hammer refresh command to the memory device 10 through the device interface 23. The access command may be a signal that instructs the memory device 10 to write or read the data by accessing a row of a memory cell array 11 corresponding to the address ADDR. The row-hammer refresh command may be a signal that commands the memory device 10 to perform an additional refresh operation on a word line that is adjacent to word lines that are intensively accessed during a short time period. In other words, the additional refresh operation may be performed on a word line that is adjacent to word lines that are accessed a large number of times during a short time period. The large number of accesses may be the result of repeated requests to access the same word line.

The address generator 22 in the memory controller 20 may generate a row address and a column address to access in the memory cell array 11 by decoding, the address ADDR received from the host interface 24. In addition, the memory device 10 may generate an address of a bank to access when the memory cell array 11 includes a plurality of banks.

Furthermore, the memory controller 20 may control memory operations such as write and read by providing various signals to the memory device 10 through the device interface 23. For example, the memory controller 20 may provide a precharge command to the memory device 10. The precharge command may be a command for shifting a state of the memory cell array 11 from an active state to a standby state after a write or read operation is complete.

According to an embodiment of the inventive concept, when the memory controller 20 provides an access command to the memory device 10, the memory controller 20 may transmit an address ADDR of a row to be accessed to the memory device 10, together with the access command. When the memory controller 20 provides the row-hammer refresh command to the memory device 10, addresses of target rows that are intensively accessed may be transmitted to the memory device 10 together with the row-hammer refresh command. When the memory device 10 receives the row-hammer refresh command and the addresses of the target rows, the memory device 10 may perform an additional refresh operation on word lines adjacent to a word line corresponding to the target row. For example, if there are first, second and third word lines arranged in sequence and the target row is the second word line, the extra refresh operation may be performed on the first and third word lines.

The memory device 10, which is a storage device based on a semiconductor device, may include the memory cell array 11, an address buffer 12, a minimum access output circuit 13, and a control circuit 14. For example, the memory device 10 may be a random access memory (RAM) device, such as dynamic random access memory (DRAM), synchronous DRAM (SDRAM), static RAM (SRAM), double data rate SDRAM (DDR SDRAM), DDR2 SDRAM, DDR3 SDRAM, phase-change RAM (PRAM), magnetic RAM (MRAM), resistive RAM (RRAM), and the like. In addition, the memory device 10 may include other types of memory device requiring a refresh operation. For example, when the memory device 10 includes a resistive memory device that performs a refresh operation, the memory device 10 may include a non-volatile memory device. The memory device 10 may, in response to the address ADDR and the command CMD received from the memory controller 20, receive or output data through data lines or perform the refresh operation.

The memory cell array 11 may include a plurality of memory cells, and the plurality of memory cells may be connected to word lines and bit lines. The control circuit 14 may write data to the memory cell array 11 or read data from the memory cell array 11, based on the command CMD and the address ADDR received from the memory controller 20, or may provide a control signal CTRL, which is for refreshing the memory cells included in the memory cell array 11, to a row decoder and a column decoder. In other words, the control circuit 14 may perform all operations to process the data in the memory cell array 11.

The memory device 10, in response to a normal refresh command of the memory controller 20, may perform a normal refresh operation on at least some of the memory cells in the memory cell array 11. For example, when the memory device 10 performs the normal refresh operation, memory cell rows in the memory cell array 11 may be sequentially refreshed. The memory device 10 may, in response to the row-hammer refresh command of the memory controller 20, perform the refresh operation on at least some of the memory cells in the memory cell array 11. When the memory device 10 performs the refresh operation in response to the row-hammer refresh command, the memory device 10 may perform the refresh operation on the word lines adjacent to the word line corresponding to the target row. In other words, the refresh operation may only be performed on the word lines adjacent to the word line of a target row. However, the refresh operation may be extended to cover at least two word lines on each side of the word line of the target row.

The address buffer 12 in the memory device 10 according to an embodiment of the inventive concept may store addresses of the target rows intensively accessed among a plurality of rows. In addition, the address buffer 12 may include a counting circuit, and the counting circuit may include a plurality of counters corresponding to the number of target rows. Accordingly, the address buffer 12 may map and store the addresses of the target rows and an access count CNT corresponding to each of the addresses, and information to which the addresses of the target rows and the access counts are mapped may be stored in an intrinsic index.

The minimum access output circuit 13 may output an index value MIN of a row that is accessed a minimum number of times among the target rows by receiving index values IDXs respectively corresponding to the target rows and access counts CNTs for the target rows. For example, when there are a plurality of rows accessed a minimum number of times, the minimum access output circuit 13 may select one of the plurality of rows as a minimum access row based on a selection command value. Hereinafter, the one row selected from the plurality of rows will be referred to as a minimum access row. The minimum access output circuit 13 may include plurality of input comparators, and selecting the minimum access row based on a result of a comparison of the plurality of input comparators will be described in detail with reference to FIGS. 3 through 7A.

The control circuit 14, which receives an index value MIN corresponding to the minimum access row from the minimum access output circuit 13, may transmit a control signal CTRL to the address buffer 12, wherein the control signal CTRL replaces a row address corresponding to the index value MIN with an address ADDR of an access row that has been recently accessed. Hereinafter, a row to be replaced by the memory device 10 to correspond to the minimum access row among the target rows recently accessed by the memory device 10 may be referred to as an access row.

According to an embodiment of the inventive concept, the memory device 10 may update the target rows each time the memory cell row is accessed, and when there are a plurality of rows having, a minimum access count CNT among the target rows, the memory device 10 may perform the row-hammer refresh operation by randomly selecting any one of the plurality of rows and replacing the selected row with a recent access row.

Figure 2:
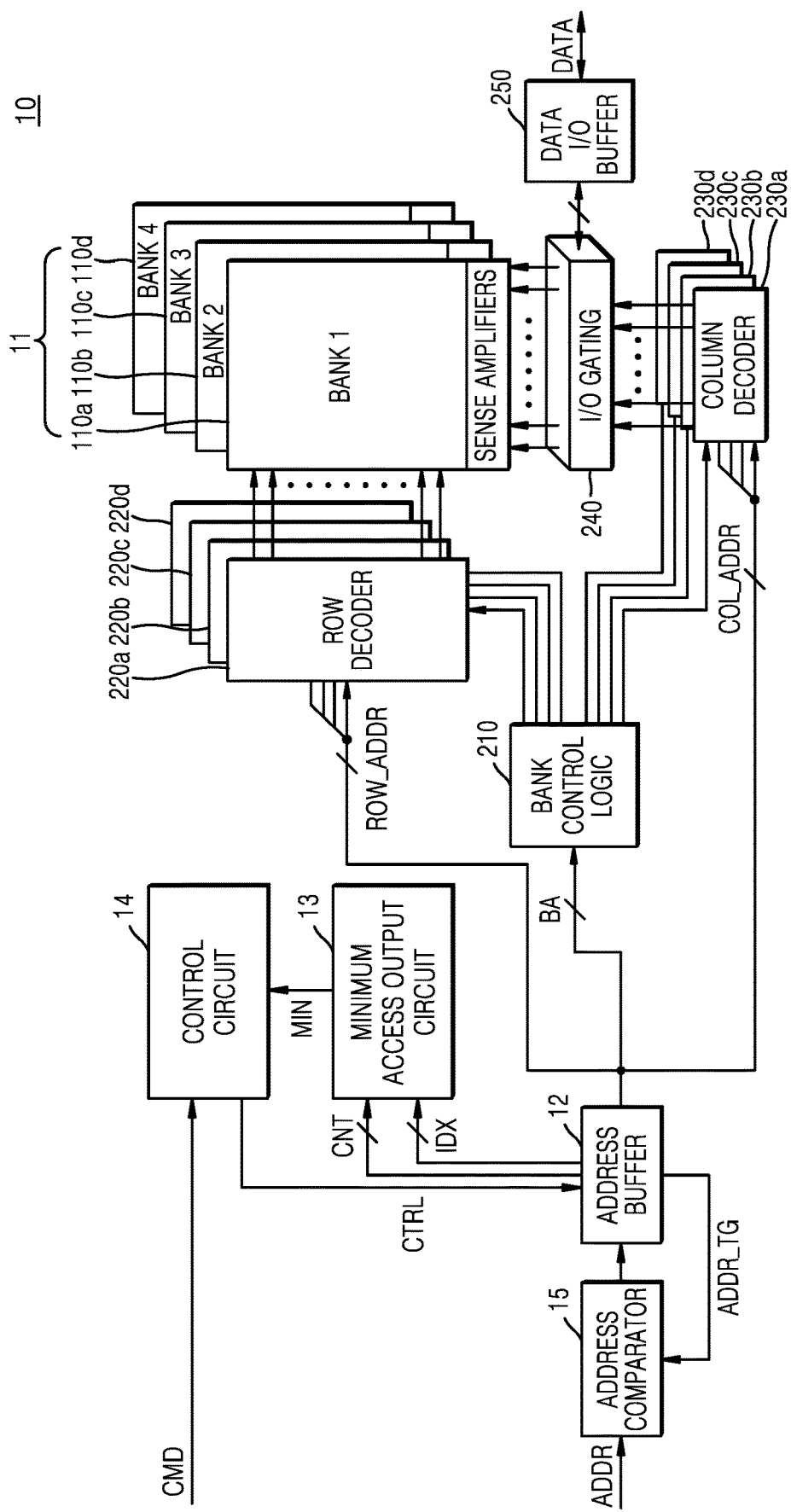
FIG. 2 is a block diagram of a memory device according to an embodiment of the inventive concept.

FIG. 2 is a block diagram of the memory device 10 according to an embodiment of the inventive concept. Descriptions that are the same as those of FIG. 1 may be omitted.

Referring to FIG. 2, the memory device 10 may include the memory cell array 11, the address buffer 12, the minimum access output circuit 13, the control circuit 14, an address comparator 15, a plurality of row decoders 220a through 220d (e.g., a first row decoder 220a, a second row decoder 220b, a third row decoder 220c, and a fourth row decoder 220d), a plurality of column decoders 230a through 230d (e.g., a first column decoder 230a, a second column decoder 230b, a third column decoder 230c, and a fourth column decoder 230d), a bank control logic 210, an input/output gating circuit 240, and a data input/output circuit 250. In addition, the memory cell array 11 may include a plurality of banks 110a through 110d (e.g., a first bank 110a, a second bank 110b, a third bank 110c, and a fourth bank 110d), and a plurality of sense amplifiers respectively corresponding to the plurality of banks 110a through 110d may be in the memory cell array 11.

The memory device 10 may be dynamic random access memory (DRAM), such as double data rate synchronous dynamic random access memory (DDR SDRAM), low power double data rate (LPDDR) SDRAM, graphics double data rate (GDDR) SDRAM, rambus dynamic random access memory (RDRAM), and the like.

The control circuit 14 may control all operations of the memory device 10, and may generate control signals CTRL to perform a write operation or a read operation according to the command CMD received from the memory controller 20. In addition, the control circuit 14 may generate control signals CTRL for a normal refresh operation on the first through fourth banks 110a through 110d, in response to a refresh command, and may generate control signals CTRL commanding an additional refresh operation on rows adjacent to the target rows in response to the row-hammer refresh command. However, the command of the refresh operation performed by the control circuit 14 is not limited thereto. For example, even if the control circuit 14 does not receive the refresh command from the memory controller 20 or the host device HOST, the control circuit 14 may periodically generate the control signal CTRL for the refresh operation depending on particular operation mode.

According to an embodiment of the inventive concept, the memory device 10 may further include the address comparator 15. The address comparator 15 may compare an access address ADDR, which is received from the memory controller 20, with an address ADDR_TG corresponding to a target row stored in the address buffer 12. As a result of the comparison of the access address ADDR with the address ADDR_TG corresponding to the target row, when the access address ADDR is one of the addresses ADDR_TG corresponding to any one row among the target rows, accesses to the corresponding rows among the target rows may be counted. On the contrary, when the target row addresses ADDR_TG do not include the access address ADDR, the memory device 10 may determine whether there is an available buffer in the address buffer 12 to additionally store the access address ADDR, and when there is no available buffer, the memory device 10 may select a row with the smallest access count among the target rows.

The address stored in the address buffer 12 may include a bank address BA, and may also include a row address ROW_ADDR and a column address COL_ADDR to command a control operation in the memory cell array 11. The address buffer 12 may provide row addresses ROW_ADDRs to the row decoders 220a through 220d, and may provide column addresses COL_ADDRs to the column decoders 230a through 230d. For example, according to an embodiment of the inventive concept, the row addresses ROW_ADDRs may be provided to one of the row decoders 220a through 220d through a row address selector, and the column addresses COL_ADDRs may be provided to one of the column decoders 230a through 230d through a column address latch. In addition, the address buffer 12 may provide the bank address BA to the bank control logic 210.

The bank control logic 210 may generate bank control signals in response to the bank address BA. In addition, in response to the bank control signals, one of the first row decoder 220a through the fourth row decoder 220d corresponding to the bank address BA may be activated, and one of the first column decoder 230a through the fourth column decoder 230d corresponding to the bank address BA may be activated.

The memory device 10 may perform the control operation on the memory cell array 11 by applying a signal through a word line and a bit line respectively corresponding to the row address ROW_ADDR and the column address COL_ADDR after activating one of the first row decoder 220a through the fourth row decoder 220d and one of the first column decoder 230a through the fourth column decoder 230d corresponding to the bank address BA. For example, to perform the row-hammer refresh operation, the memory device 10 may designate a row address ROW_ADDR of a word line to be refreshed in one of the first row decoder 220a through the fourth row decoder 220d, and may sequentially perform the refresh operation on adjacent rows of the target row by applying a voltage for performing the refresh operation on the word line of the corresponding row address ROW_ADDR. The performance of the control operation by the memory device 10 is not limited to the row-hammer refresh operation and may also be applied to the write or read operation, and when the memory device 10 performs the read operation, data of a memory cell to which a read voltage is applied may be provided to the memory controller 20 or the host device through the input/output gating circuit 240 and the data input/output buffer 250.

Figure 3A:
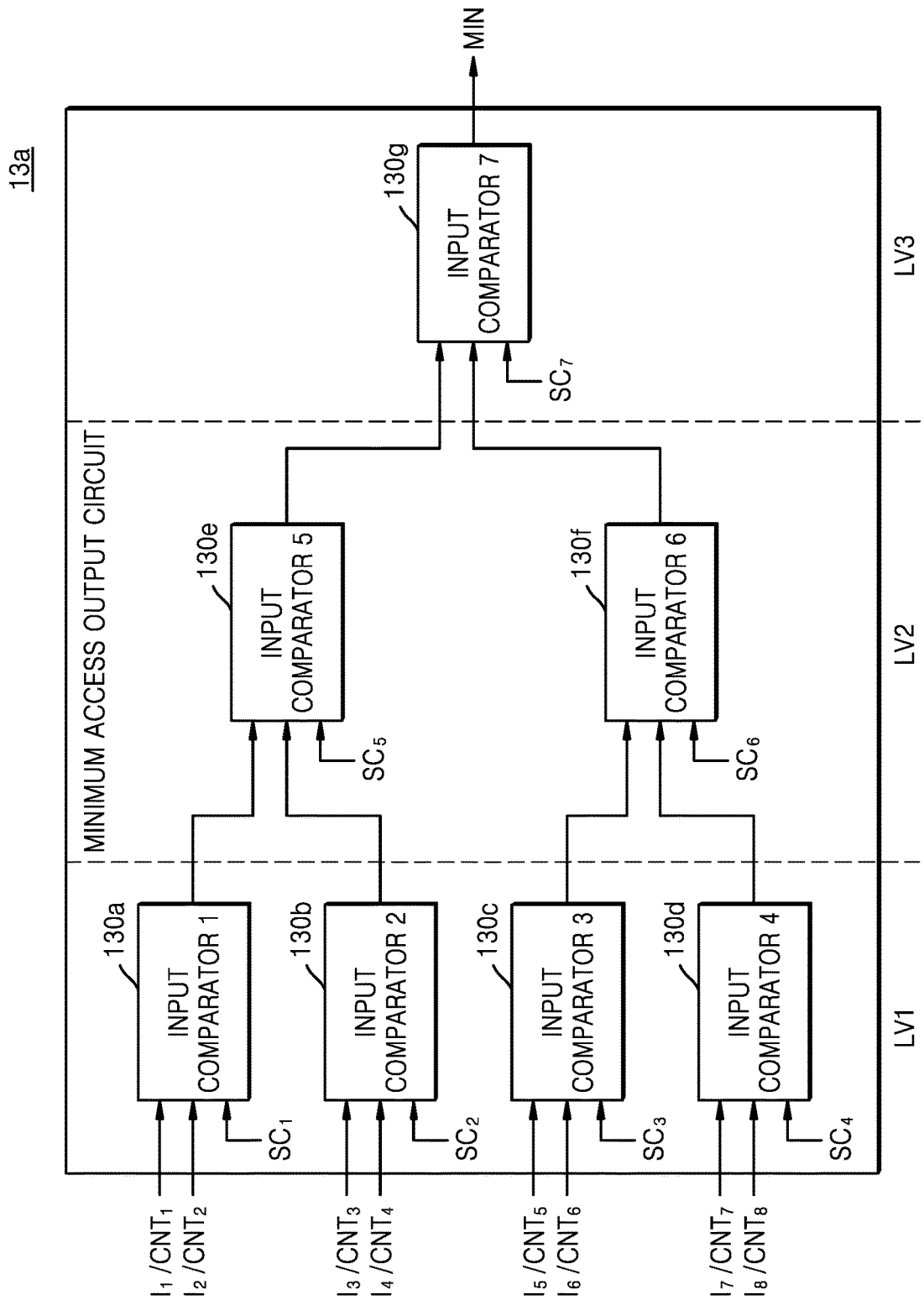
FIGS. 3A and 3B are block diagrams of a minimum access output circuit including a plurality of input comparators, according to an embodiment of the inventive concept.
Figure 3B:
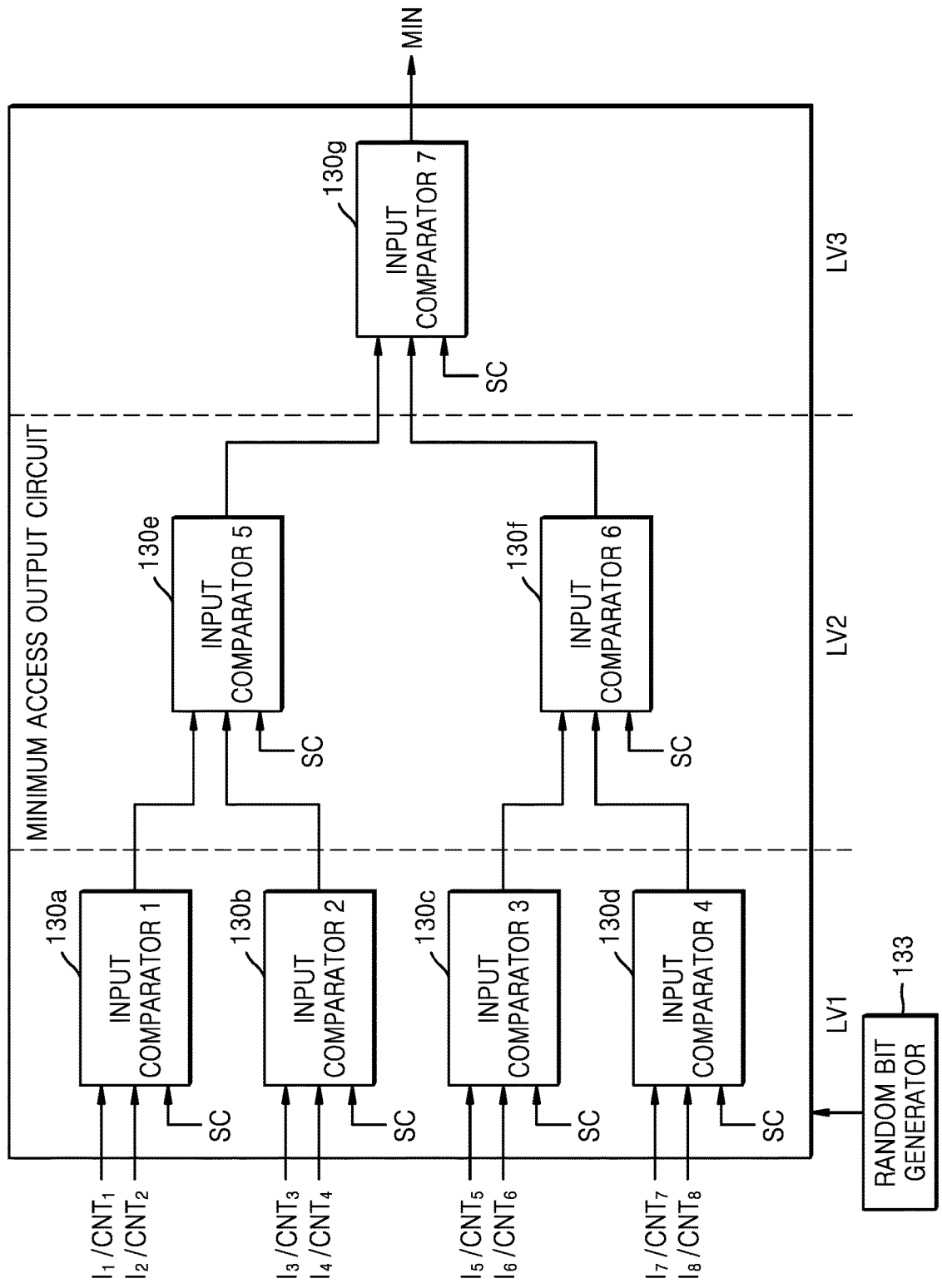

FIGS. 3A and 3B are each a block diagram of the minimum access output circuit 13 including a plurality of input comparators 130, according, to an embodiment of the inventive concept.

Referring to FIG. 3A, a minimum access output circuit 13a may include the plurality of input comparators 130 (e.g., a first input comparator 130a, a second input comparator 130b, a third input comparator 130c, a fourth input comparator 130d, a fifth input comparator 130e, a sixth input comparator 130f, and a seventh input comparator 130g), and the plurality of input comparators 130 may be connected in a binary-tree form. Each of the input comparators 130 may receive two pieces of input data, and may output any one of the two pieces of input data by comparing the two pieces of input data with each other. Since the plurality of input comparators 130 are connected in the binary-tree form, final output data may be generated by receiving output data at a previous level as input data.

According to an embodiment of the inventive concept, each of the input comparators 130 may receive index values Is of a first row and a second row (e.g., a first row index value $I_1$ and a second row index value $I_2$) and access counts CNTs of a first row and a second row (e.g., a first row access count $CNT_1$ and a second row access count $CNT_2$) among the target rows, and may output an index value I and an access count CNT of any one of the first row and the second row (e.g., any one of the first row index value $I_1$ and the second row index value $I_2$ and any one of the first row access count $CNT_1$ and the second row access count $CNT_2$) by comparing the access counts CNTs (e.g., the first row access count $CNT_1$ with the second row access count $CNT_2$). Since the minimum access output control circuit 13a is a circuit for selecting a row having the smallest access count CNT among the target rows, each of the input comparators 130 may output a row having a smaller access count CNT between the first row and the second row.

In this case, according to an embodiment of the inventive concept, when the access count of the first row ($CNT_1$) and the access count of the second row ($CNT_2$) are identical to each other, the input comparator 130 may output any one of the first row and the second row based on a selection command value SC. The selection command value SC may be a command bit that is adaptively determined according to an internal situation of a circuit, but also may be a command bit that is randomly determined. For example, when the selection command value SC input to the input comparator 130 is zero, the input comparator 130 may output an index value $I_1$ and an access count $CNT_1$ corresponding to the first row, and when the selection command value SC is one, the input comparator 130 may output an index value $I_2$ and an access count $CNT_2$ corresponding to the second row.

When the selection command value SC is randomly determined, the index value corresponding to the first row $I_1$ and the index value corresponding to the second row $I_2$ may also be randomly determined, and thus, the minimum access output circuit 13a may, at each time, output an index value corresponding to a different minimum access row. Accordingly, even when row-hammer attack patterns are sequentially repeated in a round-robin type, the memory device 10 according to an embodiment of the inventive concept may irregularly update at least some of the target rows and perform the row-hammer refresh operation without missing information on the target rows that are intensively accessed.

An embodiment of the inventive concept shown in FIG. 3A shows an example in which the minimum access output circuit 13a includes the input comparators 130 of a third-level (e.g., LV1 through LV3) binary-tree that compares eight input signals (e.g., $I_1$ through $I_8$) and outputs an index value I of a target row corresponding to the smallest access value CNT among eight access counts CNTs (e.g., $CNT_1$ through $CNT_8$). However, the number of target rows input to the minimum access output circuit 13a and the input comparators 130 according to an embodiment of the inventive concept are not limited thereto.

Referring to FIG. 3A, the input comparators 130 may respectively receive selection command values SC (e.g., first through seventh selection command values $SC_1$ through $SC_7$) generated by different random bit generators, but are not limited thereto, and as shown in a minimum access output circuit 13b of FIG. 3B, all the input comparators 130 may receive a selection command value SC output by one random bit generator 133.

Figure 4:
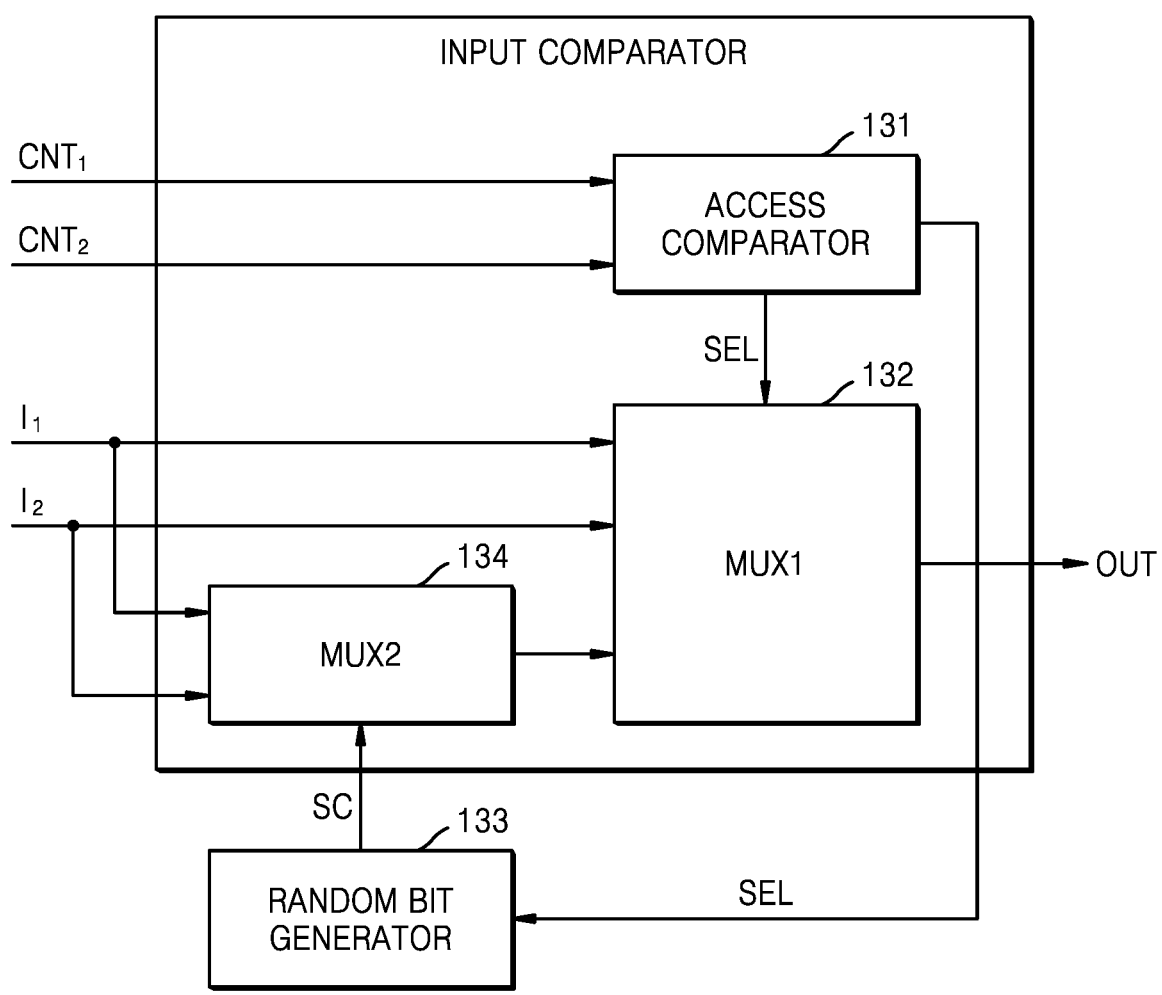
FIG. 4 is a block diagram of an input comparator and transmitted/received signals according to an embodiment of the inventive concept.

FIG. 4 is a block diagram of the input comparator 130 and transmitted/received signals according to an embodiment of the inventive concept.

Referring to FIG. 4, each of the input comparators 130 may receive first row index value $I_1$, a second row index value $I_2$, the first row access count CNT1, and the second row access count CNT2, where the first row is different from the second row, and may output any one of the first row index value I1 and the second row index value I2 by comparing the first row access count CNT1 to the second row access count CNT2. The input comparator 130 may include an access comparator 131, a first multiplexer 132, a second multiplexer 134, and a random bit generator 133.

The access comparator 131 of the input comparator 130 may compare the first row access count $CNT_1$ to the second row access count $CNT_2$, thereby generating a result of the comparison as a selection signal SEL input to the first multiplexer 132. The first multiplexer 132 may receive the selection signal SEL, the first row index value $I_1$, and the second row index value $I_2$, and, based on the selection signal SEL, determine which one of the first row index value $I_1$ and the second row index value $I_2$ to output.

When the first row access count $CNT_1$ is identical to the second row access count $CNT_2$, the access comparator 131 may provide a tie break command signal as the selection signal SEL to the first multiplexer 132, and the first multiplexer 132, which received the tie break command signal, may generate the index value (one of the first row index value $I_1$ and the second row index value $I_1$), which is output from the second multiplexer 134, as an output signal OUT of the input comparator 130.

According to an embodiment of the inventive concept, the second multiplexer 134 may output any one of the first and second row index values $I_1$ and $I_2$ based on the selection command value SC generated by the random bit generator 133. The random bit generator 133 may include, for example, a linear feedback shift register (LFSR), and may output a pseudo-random number bit as the selection command value SC based on the LFSR.

Accordingly, the input comparator 130 may receive an index value and an access count and output an index value of a row to which a smaller access count is written, and when the access counts are identical to each other, the input comparator 130 may randomly output the index value of any one of the first row and the second row (e.g., one of the first row index value $I_1$ and the second row index value $I_2$).

According to an embodiment of the inventive concept, the random bit generator 433 may determine whether to be activated by receiving the selection signal SEL of the access comparator 131. In other words, the random bit generator 133 may be activated by the selection signal SEL. For example, the random bit generator 133 may be activated in response to a determination that the access counts of the first row and the second row are identical to each other, and when the access comparator 131 determines that an access count of any one row between the first row and the second row is greater, the random bit generator 133 may be deactivated. Accordingly, the random bit generator 133 is deactivated when the second multiplexer 134 is not required to output the index value, and thus, the random bit generator 133 may be efficiently driven.

Figure 5:
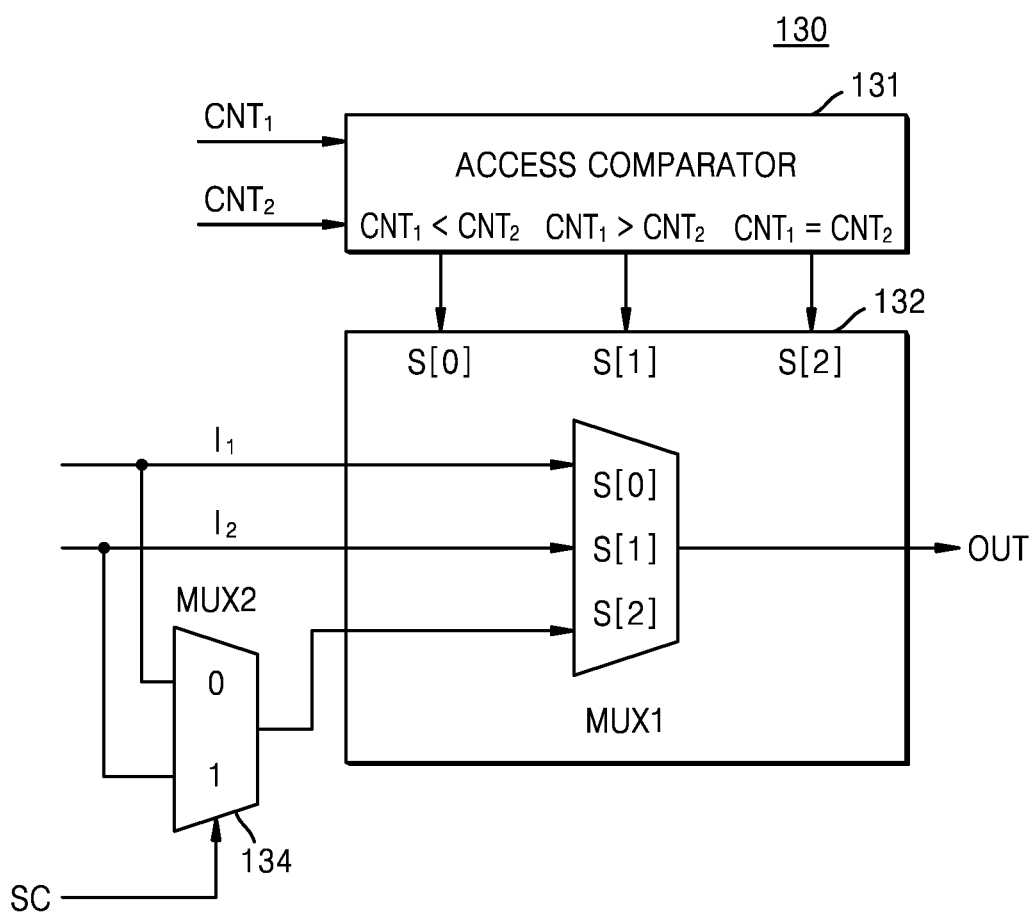
FIG. 5 is a circuit diagram of an input comparator and internal signals according to an embodiment of the inventive concept.

FIG. 5 is a circuit diagram of the input comparator 130 and internal signals according to an embodiment of the inventive concept.

Retelling to FIG. 5, the first multiplexer 132 may be a multiplexer which outputs any one of three input signals, and may determine the output data OUT by receiving an input of a result of a comparison of the access comparator 131 as the selection signal. The second multiplexer 134 may be a multiplexer which outputs any one of two input signals, and may determine the output data by receiving an input of the selection command value SC as the selection signal. The output data of the second multiplexer 134 may be applied as any one of the input signals of the first multiplexer 132.

The access comparator 131 in the input comparator 130 may generate the selection signal (e.g., one of the first input signal S[0], the second input signal S[1], and the third input signal S[2]) by comparing the first row access count $CNT_1$ with the second row access count $CNT_2$. When the first row access count $CNT_1$ is less than the second row access count $CNT_2$, the access comparator 131 may output the first selection signal S[0], and when the second row access count $CNT_2$ is less than the first row access count $CNT_1$, the access comparator 131 may output the second selection signal S[1]. In addition, when the first row access count $CNT_1$ is equal to the second row access count $CNT_2$, the access comparator 131 may output the third selection signal S[2]. The first multiplexer 132, which received the first selection signal S[0], may generate the first row index value $I_1$ as the output data OUT, and the second multiplexer 134, which received the second selection signal S[1], may generate the second row index value $I_2$ as the output data OUT.

According to an embodiment of the inventive concept, when the access comparator 131 determines that the first row access count $CNT_1$ and the second row access count $CNT_2$ are identical to each other, the access comparator 131 may apply the third selection signal S[2] to the first multiplexer 132. In addition, the access comparator 131 may activate the random bit generator 133 by providing the third selection signal S[2] to the random bit generator 133. The first multiplexer 132, which received the third selection signal S[2], may generate the output data of the second multiplexer 134 as the output data OUT of the first multiplexer 132.

The second multiplexer 134 may, according to the selection command value SC of the random bit generator 133, generate the first row index value $I_1$ or the second row index value $I_2$ as the output data. For example, the selection command value SC of the random bit generator 133 may be a 1-bit signal, and when the selection command value SC is zero, the second multiplexer 134 outputs the first row index value $I_1$, and when the selection command value SC is one, the second multiplexer 134 may output the second row index value $I_2$.

Since the random bit generator 133 randomly provides the selection command value SC of one bit as the selection signal to the second multiplexer 134, the second multiplexer 134 may randomly provide any one of the first row index value $I_1$ and the second row index value $I_2$ to the first multiplexer 132. When the first row access count $CNT_1$ and the second row access count $CNT_2$ are identical to each other, the first multiplexer 132 may receive the third selection signal S[2], thereby generating the output data of the second multiplexer 134, which is randomly output as any one of the first row index value $I_1$ and the second row index value $I_2$, as the output data OUT of the first multiplexer 132.

FIGS. 6A through 6C each include a table showing an example of outputting an index value of the minimum access row according to an embodiment of the inventive concept.

Referring to FIGS. 3A and 3B, FIG. 6A shows an example of comparing access counts based on the input comparators 130 at a first level LV1 in the minimum access output circuit 13, FIG. 6B shows an example of comparing the access counts based on the input comparators 130 at a second level LV2 in the minimum access output circuit 13, and FIG. 6C shows an example of comparing the access counts based on the input comparators 130 at a third level LV3 in the minimum access output circuit 13. FIGS. 6A through 6C show examples of comparing the access counts with respect to eight target rows, but embodiments of the inventive concept are not limited thereto and may include any embodiments of comparing access counts with respect to $2^n$ (where n is a natural number) target rows.

Referring to FIG. 6A, the address buffer 12 may map and store the addresses ADDRs and access counts COUNT of the target rows that are intensively accessed among the memory cell rows, and may allot mapped information to index values INDEX and store the information. For example, the address buffer 12 may allot the address ADDR and the access counts COUNTs to eight index values INDEX (e.g., 1 through 8) and store the address ADDR and the access counts COUNTs. For example, address 'ADDR1' and access count '32' may be mapped to index value 1.

The minimum access output circuit 13 may receive the index values and the access counts of the target rows from the address buffer 12 in response to the row-hammer refresh command by the memory device 10. The first level LV1 of the minimum access output circuit 13 may include input comparators 130 in a number corresponding to half the number of target rows, and each of the input comparators 130 may, by receiving index values and access counts of two target rows, output an index value and an access count of a target row having a smaller access count.

According to an embodiment of the inventive concept shown in FIG. 6A, the first input comparator 130a may compare access counts corresponding to a first index $I_1$ and a second index $I_2$, the second input comparator 130b may compare access counts corresponding to a third index $I_3$ and a fourth index $I_4$, the third input comparator 130c may compare access counts corresponding to a fifth index $I_5$ and a sixth index $I_6$, and the fourth input comparator 130d may compare access counts corresponding to a seventh index $I_7$ and an eighth index $I_8$. The first input comparator 130a may output data corresponding to the second index $I_2$, the second input comparator 130l may output data corresponding to the third index $I_3$, and the fourth input comparator 130d may output data corresponding to the seventh index $I_7$.

In this example, the third input comparator 130c may compare the access counts corresponding to the fifth index $I_5$ to the access count corresponding to the sixth index $I_6$ to each other; however, since an access count corresponding to the fifth index $I_5$ is identical to an access count corresponding to the sixth index $I_6$, the third input comparator 130c may output data corresponding to any one of the fifth index $I_5$ and the sixth index $I_6$ according to the selection command value SC that is generated based on the random bit generator 133. For example, when the third selection command value $SC_3$ generated based on the random bit generator 133 is zero, the third input comparator 130c may output data corresponding to the fifth index $I_5$, and when the third selection command value $SC_3$ is one, the third input comparator 130c may output data corresponding to the sixth index $I_6$.

Referring to FIGS. 3A, 3B and 6B, the number of fifth input comparator 130e and sixth input comparator 130f of the second level LV2 may be half the number of input comparators 130 of the first level LV1, and the fifth input comparator 130e and the sixth input comparator 130f of the second level LV2 may receive output data of the first input comparator 430a through the fourth input comparator 130d of the first level LV1.

According to an embodiment of the inventive concept shown in FIG. 6B, the fifth input comparator 130e may compare an access count of the output data generated from the first input comparator 130a to an access count of the output data generated from the second input comparator 130b, and the sixth input comparator 130f may compare access counts of the output data generated from the third input comparator 130c and the fourth input comparator 130d. For example, the fifth input comparator 130e may compare the access count corresponding to the second index $I_2$ and the access count corresponding to the third index $I_3$, and since the access count corresponding to the third index $I_3$ is less than the access count corresponding to the second index $I_2$, the fifth input comparator 130e may output data corresponding to the third index $I_3$. The sixth input comparator 130f may output data corresponding to the fifth index $I_5$ or the sixth index $I_6$ based on a result of the comparison of the access counts. This is so, because the access counts of the fifth index $I_5$ or the sixth index $I_6$ are less than the access count of the seventh index $I_7$.

Referring to FIGS. 3A, 3B, and 6B, the third level LV3 of the minimum access output circuit 13 may include the seventh input comparator 130g corresponding to half the number of input comparators 130 of the second level LV2, and the seventh input comparator 130g of the third level LV3 may receive output data from the fifth input comparator 130e and the sixth input comparator 130f of the second level LV2.

According to an embodiment of the inventive concept shown in FIG. 6C, the seventh input comparator 130g may compare access counts among the output data of the fifth input comparator 130e and the sixth input comparator 130f to each other, and may generate an index value corresponding to the minimum access row based on a result of the comparison of the access counts. For example, the seventh input comparator 130g may compare the access count corresponding to the third index $I_3$ and the access count corresponding to the fifth index $I_5$ or the sixth index $I_6$, and since both access counts are four, the seventh input comparator 130g may output any one of the third index $I_3$, the fifth index $I_5$, and the sixth index $I_6$ as the index corresponding to the minimum access row based on the selection command value SC (or $SC_7$). When the selection command value SC (or $SC_7$) is zero, the seventh input comparator 130g may output the third index $I_3$, and when the selection command SC (or $SC_7$) is one, the seventh input comparator 130a may output the fifth index $I_5$ or the sixth index $I_6$.

Accordingly, the minimum access output circuit 13 may determine any one of the third index $I_3$, the fifth index $I_5$, and the sixth index $I_6$, which correspond to the minimum access count among the plurality of target rows stored in the address buffer 12, as an index corresponding to the minimum access row. Here, the minimum access output circuit 13 according to an embodiment of the inventive concept may randomly select any one of the third index $I_3$, the fifth index $I_5$, and the sixth index $I_6$, and therefore, repeated selection of any one index may be prevented.

Figure 7A:
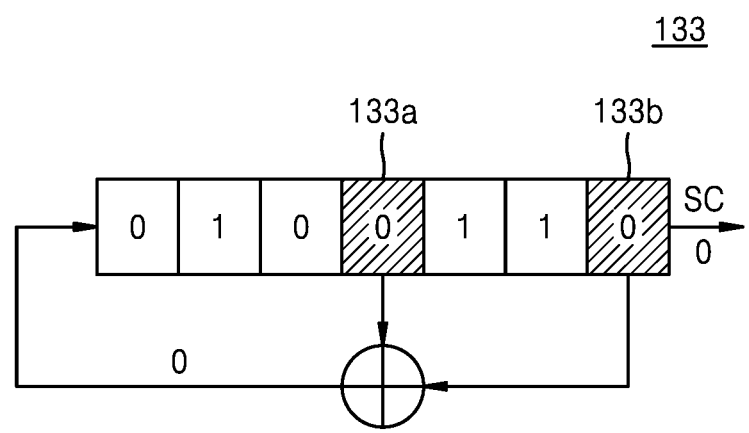
FIGS. 7A and 7B each include a diagram of an operating method of a random bit generator according to an embodiment of the inventive concept.
Figure 7B:
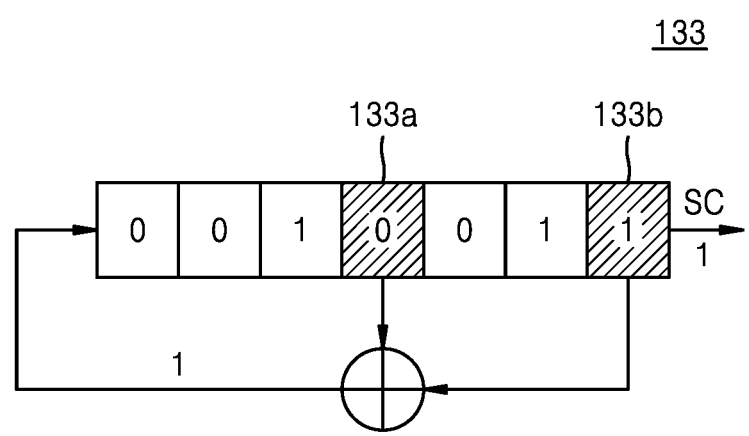

FIGS. 7A and 7B each include a diagram of an operating method of the random bit generator 133 according to an embodiment of the inventive concept.

Referring to FIGS. 7A and 7B, the random bit generator 133 may include the LFSR, and may output an output bit of the LFSR as the selection command value SC. The LFSR may determine a feedback bit based on a characteristic polynomial having zero or one as a coefficient, and the feedback bit may be input as data at one end at the LFSR. At this time, the LFSR may output data at the other end as the selection command value SC of the LFSR.

The characteristic polynomial of the LFSR may be a polynomial commanding a bit position to be provided as feedback. The LFSR may output, as feedback bits, bits at bit positions corresponding to an order of a coefficient of one in the characteristic polynomial. In this case, when the feedback bit includes a plurality of bits, the LFSR may sum up the plurality of bits, thereby providing the plurality of bits to the one end of the LFSR. For example, when the characteristic polynomial of the LFSR is as shown in Equation 1 below, the LFSR may output bits corresponding to a seventh bit position 133b and a fourth bit position 133a as feedback bits, and may provide the feedback bits to the one end of the LFSR by summing up the feedback bits.

$$f(x)=x^7+x^4+1 \qquad \text{[Equation 1]}$$

According to FIG. 7A, the LFSR may output zero, which is a bit corresponding to the fourth bit position 133a, and zero, which is a bit corresponding to the seventh bit position 133b, as the feedback bits, and may provide zero to the input of the LFSR, which is a value obtained by summing up the two bits. Here, the random bit generator 133 may output zero, which is a bit corresponding to a bit position at the end of the LFSR, as the selection command value SC.

According to FIG. 7B, after the selection command value SC is output, the bit that is the sum of bits corresponding to the fourth bit position 133a and the seventh bit position 133b may be input to the one end of the LFSR, and the bits respectively stored in the bit positions may be shifted one by one toward the other end of the LFSR. For example, the bits may be shifted right in the example shown in FIG. 7B. Here, the random bit generator 133 may output one, which is a bit stored at the bit position at the output end of the LFSR, as the selection command value SC. The random bit generator 133 may output one, which is the bit stored at the seventh bit position 133b, and zero, which is the bit stored at the fourth bit position 133a, as the feedback bits, and may input one, which is a bit obtained by summing one and zero, to the input end of the LFSR.

The random bit generator 133 according to FIGS. 7A and 7B may randomly generate a pseudo-random number bit as the selection command value SC, and when the access count accessing the first row is identical to the access count accessing the second row, the input comparator 130 may output an index value corresponding to any one of the first row and the second row to correspond to the selection command value SC, thereby randomly outputting an index value corresponding to any one of the two rows.

According to an embodiment of the inventive concept, the characteristic polynomial may be a primitive polynomial, and accordingly, a repetition cycle of the LFSR may be a maximum length period.

Embodiments of the inventive concept shown in FIGS. 7A and 7B are examples of the LFSR including seven bit positions and receiving feedback of two bits. However, the number of bit positions in the LFSR and the number of bits being feedback are not limited thereto.

The memory device 10 according to an embodiment of the inventive concept may receive a code corresponding to a temperature value (e.g., a temperature code) of a dual in-line memory module (DIMM), and may generate the selection command value SC based on the temperature code. The memory device 10 may, in response to a temperature code indicating a high temperature, deactivate the random bit generator 133 and provide a specific selection command value SC to the second multiplexer 134. For example, the memory device 10 may, in response to the temperature code indicating the high temperature, provide a selection command value SC having a value of one to the second multiplexer 134. On the contrary, the memory device 10 may, in response to a temperature code indicating a low temperature, may deactivate the random bit generator 133, thereby providing a pseudo-random number as the selection command value SC to the second multiplexer 134.

FIG. 8 is a flowchart of an operating method of the memory device 10 according to an embodiment of the inventive concept.

Referring to FIGS. 1 and 8, the memory device 10 may, from the memory controller 20, receive an access command and an address of an access row to be accessed. The memory device 10 may determine a minimum access row having the smallest access count among the target rows to replace any one of the addresses of the target tows stored in the address buffer 12 with the address of the access row.

In operation S10, the memory device 10 may determine whether the address of the access row received from the memory controller 20 is one of the addresses of the target rows. In other words, in operation S10, it is determined if the access row is included in the one of the target rows. According to an embodiment of the inventive concept, the addresses of the target rows may be compared to the address of the access row by the address comparator 15, and the address comparator 15 may output whether there is a matching address as a result of the comparison. When it is determined that there is an address corresponding to the access row among the addresses of the target row, the memory device 10 may perform operation S70. In operation S70, the memory device 10 may once increase the access count of the target row corresponding to the address that matches the access row in the address buffer 12.

In operation S20, when the memory device 10 determines that the address of the access row is not included in the addresses of the target rows, the memory device 10 may determine if there is space in the address buffer 12 to store more addresses of the target rows. When the address buffer 12 stores addresses of rows that are less than the number of rows included in the memory cell address, the memory device 10 may determine there is available memory space in the address buffer 12 for storing the address of the access row. When it is determined that there is available memory space in the address buffer 12, the memory device 10 may perform operation S50. In operation S50, the memory device 10 may store the address and the access count of the access row in the available memory space.

In operation S30, the memory device 10 may compare access counts of the target rows to each other. According to an embodiment of the inventive concept, each of the input comparators 130 may receive index values and access counts of the first row and the second row among the target rows, and may output an index value and an access count of any one of the first row and the second row by comparing the access counts to each other. For example, when the access counts of the first row and the second row are identical to each other, the input comparator 130 may output any one of the first row and the second row based on the selection command value SC. The selection command value SC may be a command bit that is adaptively determined according to an internal situation of the circuit, but also may be a command bit that is randomly determined. For example, when the selection command value SC input to the input comparator 130 is zero, the input comparator 130 may output the index value and the access count corresponding to the first row, and when the selection command value SC is one, the input comparator 130 may output the index value and the access count corresponding to the second row.

In operation S40, the memory device 10 may output an index value of the minimum access row having the smallest access count among the target rows. When there are plurality of rows having a smallest access count, the memory device 10 may output an index value of any one row among the plurality of rows.

In operation S60, when the memory device 10 determines the minimum access row, the address of the minimum access row in the address buffer 12 may be replaced with the address of the access row. Accordingly, even when there is a case in which row-hammer attack patterns are sequentially repeated in a round-robin fashion, the memory device 10 according to an embodiment of the inventive concept may irregularly update at least some of the target rows and perform the row-hammer refresh operation without missing information on the target rows that are intensively accessed.

Figure 9:
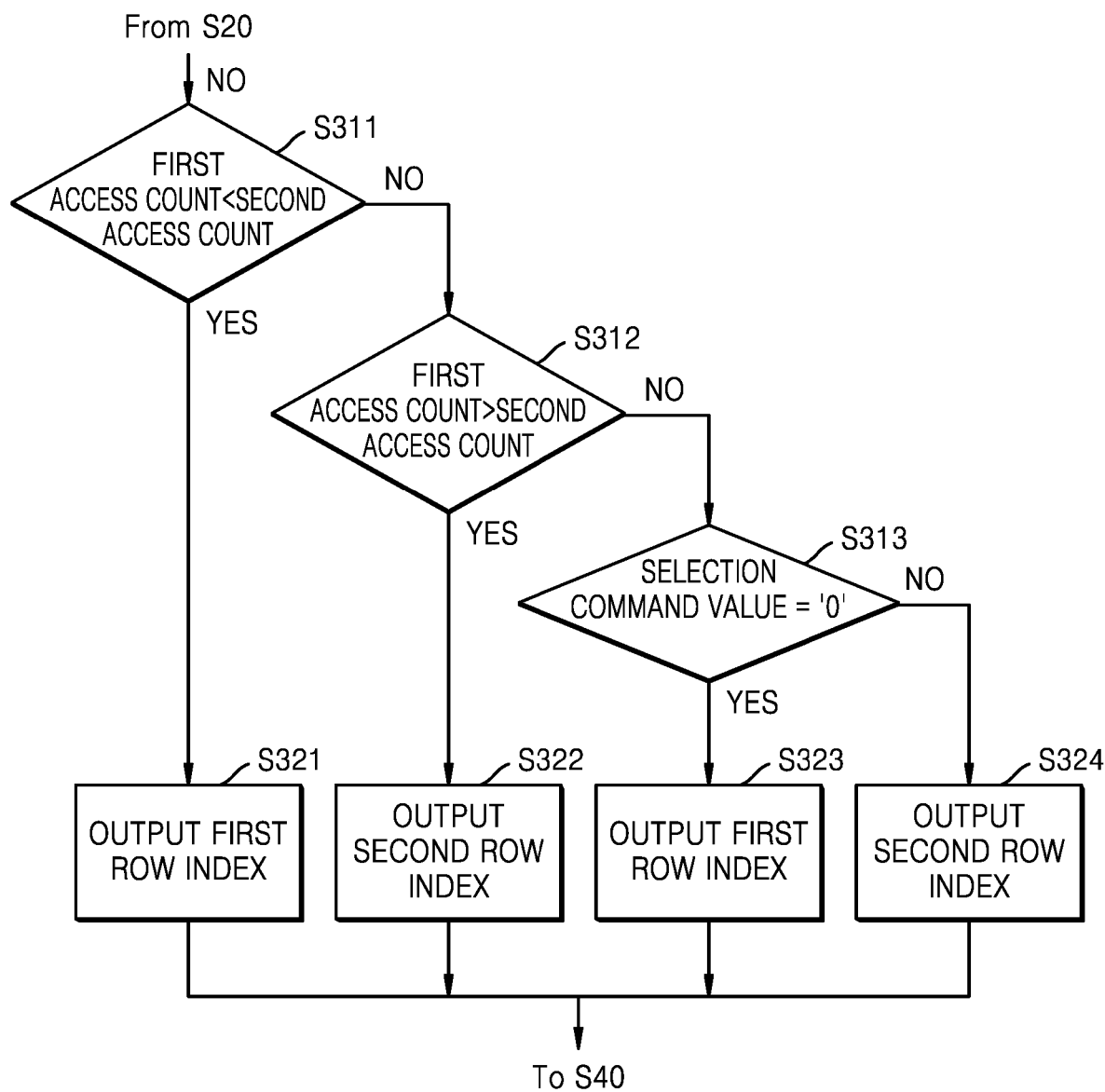
FIG. 9 is a flowchart of a method of comparing a first row access count to a second row access count according to an embodiment of the inventive concept.

FIG. 9 is a flowchart of a method of comparing access counts of a first row and a second row among target rows to each other according to an embodiment of the inventive concept.

The memory device 10 may compare the access counts of the first row and the second row among the plurality of target rows to each other, and, based on a result of the comparison, output an index value and an index count of any one of the first row and the second row.

In operation S311, the memory device 10 may compare the access counts of the first row and the second row to each other in response to a case of determining that there is more space in the address buffer 12. When it is determined that a second access count of the second row is greater than a first access count, of the first row, the memory device 10 may perform operation S321, and when it is determined that the second access count is not greater than the first access count, the memory device 10 may perform operation S312. In operation S321, since the first access count is less than the second access count, the memory device 10 may output the index value and the access count corresponding to the first row.

In operation S312, when it is determined that the first access count is greater than the second access count, the memory device 10 may perform operation S322, and when it is determined that the first access count is not greater than the second access row, the memory device 10 may perform operation S313. In other words, operation S313 may be performed when the first access count and the second access count are equal to each other. In operation S322, since the second access count is less than the first access count, the memory device 10 may output the index value and the access count corresponding to the second row.

In operation S313, the memory device 10 determines that the first access count and the second access count are identical to each other through operations S311 and S312, and may output the index value of any one of the first row and the second row based on the selection command value. For example, when the selection command value SC is zero, in operation S323, the memory device 10 may output the index value and the access count corresponding to the first row, and when the selection command value SC is not zero, in operation S324, the memory device 10 may output the index value and the access count corresponding to the second row.

The memory device 10 may compare access counts of the two rows several times to each other, and, based on a result of comparing several times, output an index value and an access count of the minimum access row having the smallest access count among the target rows.

Figure 10:
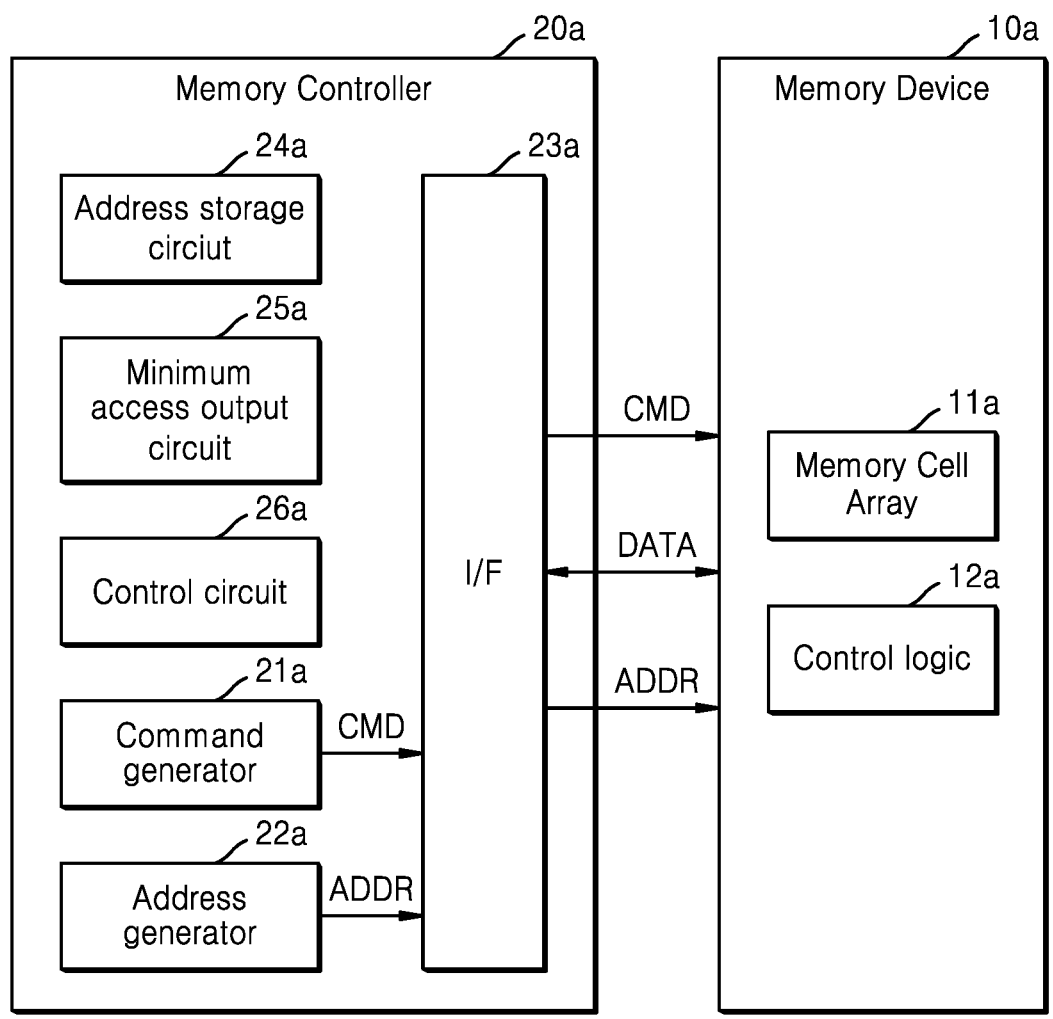
FIG. 10 is a block diagram of a memory system in which a minimum access row is determined by a memory controller, according to an embodiment of the inventive concept.

FIG. 10 is a block diagram of a memory system in which a minimum access row is determined by a memory controller 20a according to an embodiment of the inventive concept.

Referring to FIG. 10, the memory controller 20a may include an address storage circuit 24a, a minimum access output circuit 25a, a control circuit 26a, a command generator 21a, an address generator 22a, and a communication interface 23a. The memory device 10a may include a memory cell array 11a and a control logic 12a, and may perform a control operation on the memory cell array 11a by receiving a command CMD and an address ADDR from the memory controller 20a.

The address storage circuit 24a of the memory controller 20a according to an embodiment of the inventive concept may store the addresses of the target rows that are intensively accessed among the plurality of rows. In addition, the address storage circuit 24a may include a counting circuit, and the counting circuit may include a plurality of counters corresponding to the number of target rows. Accordingly, the address storage circuit 24a may map and store the addresses of the target rows and the access counts of the addresses, and may allot mapping information to the index value and store the mapping information.

The minimum access output circuit 25a may output an index value of a row that is accessed a smallest number of times among the target rows by receiving index values respectively corresponding to the target rows and access counts of the target rows. For example, when there are plurality of rows accessed a smallest number of times, the minimum access output circuit 25a may, based on the selection command value SC, select, one of the plurality of rows as the minimum access row.

The control circuit 26a may receive the minimum access row of the minimum access output circuit 25a, and may generate a control signal instructing the address corresponding to the minimum access row to be replaced with the address corresponding to the access row generated by the address generator 22a.

The command generator 21a may generate an access command or a row-hammer refresh command based on a signal received from a host device. When word lines of the rows adjacent to the target row are refreshed by generating the row-hammer refresh command, the address ADDR of the adjacent row may be transmitted to the memory device 10a together with the row-hammer refresh command.

According to the embodiment of the inventive concept shown in FIG. 10, the memory controller 20a may determine an address of a target row performing the row-hammer refresh operation, and the memory device 10a may perform the refresh operation on the word line corresponding to the adjacent row by receiving the addresses of the adjacent rows of the target rows. According to an embodiment of the inventive concept, the memory controller 20a may control the refresh operation by transmitting the address ADDR of the adjacent row, together with a target row refresh (TRR) command, to the memory device 10a.

Figure 11:
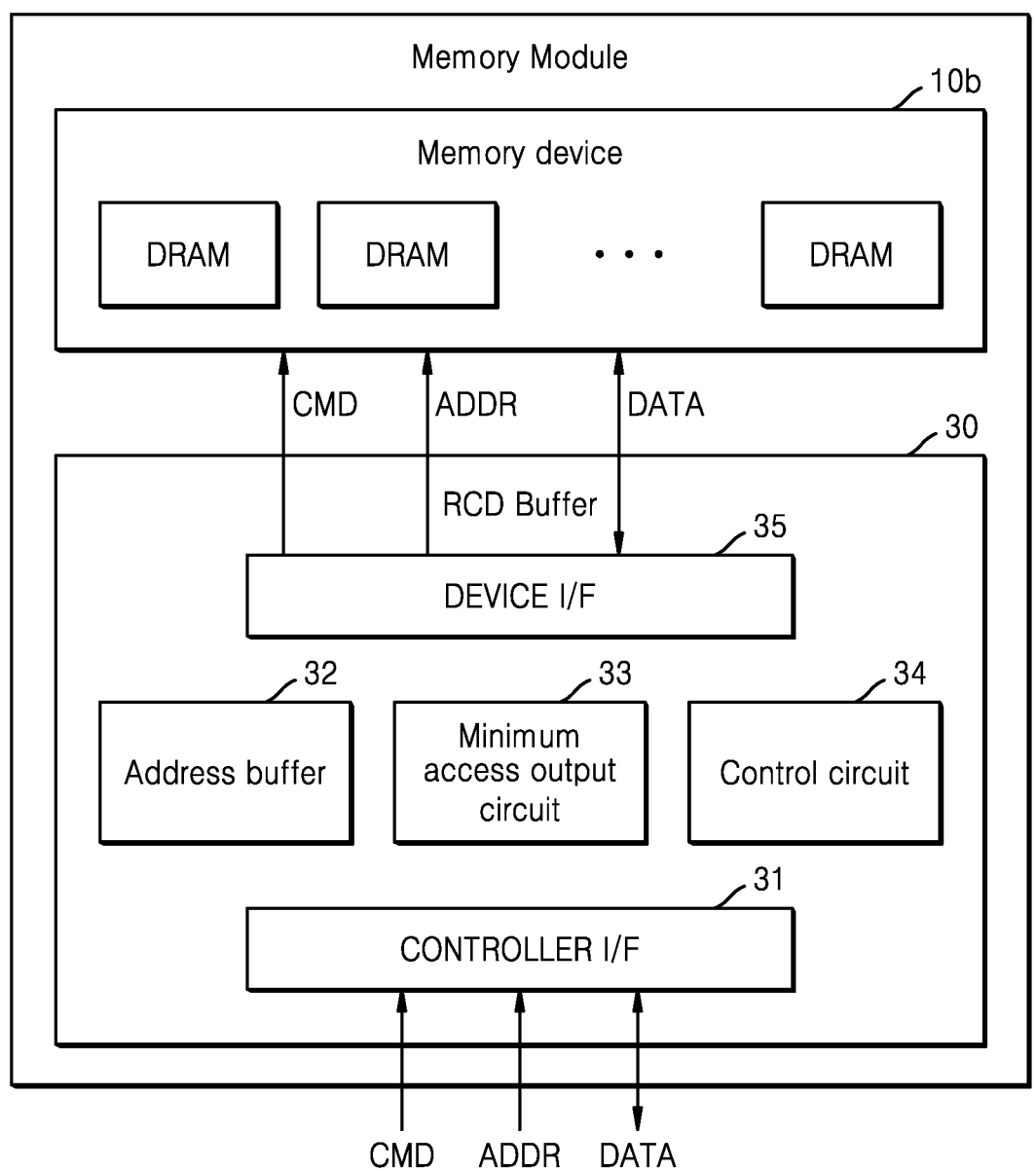
FIG. 11 is a block diagram of a memory system in which a minimum access row is determined by a register clock driver (RCD) buffer according to an embodiment of the inventive concept.

FIG. 11 is a block diagram of a memory system in which the minimum access row is determined by a register clock driver (RCD) buffer 30 according to an embodiment of the inventive concept.

Referring to FIG. 11, a memory module may include a memory device 10b and the RCD buffer 30. The memory device 10b may include a plurality of DRAM units, and may perform the row-hammer refresh operation by receiving the command CMD and the address ADDR from the RCD buffer 30. The RCD buffer 30 may buffer a command CMD or an address ADDR provided from a host device, and may provide the command CMD or the address ADDR that is buffered to the plurality of DRAM units of the memory device 10b.

The RCD buffer 30 may include a controller interface 31, an address buffer 32, a minimum access output circuit 33, a control circuit 34, and a device interface 35. Since the controller interface 31 receives the command CMD and the address ADDR from a memory controller, the RCD buffer 30 may buffer the command CMD and the address ADDR.

According to an embodiment of the inventive concept, the RCD buffer 30 may perform the row-hammer refresh operation on a target DRAM unit by buffering the command CMD and the address ADDR to correspond to each of the plurality of DRAM units. The address buffer 32 of the RCD buffer 30 may store addresses and access counts of the target rows, and the address buffer 32 of the RCD buffer 30 may store addresses of the target rows that are intensively accessed among the plurality of rows. For example, the address buffer 32 of the RCD buffer 30 may store addresses of the target rows that are repeatedly accessed among the plurality of rows. In addition, the address buffer 32 may include a counting circuit, and the counting circuit may include a plurality of counters corresponding to the number of target rows. Accordingly, the address buffer 32 may map and store the addresses of the target rows and the access counts of the addresses, and may allot mapping information to the index value and store the mapping information.

The minimum access output circuit 33 may output an index value of a row that is accessed a smallest number of times among the target rows by receiving index values respectively corresponding to the target rows and access counts of the target rows. For example, when there are a plurality of rows accessed in the smallest number of times, the minimum access output circuit 33 may, based on the selection command value SC, select one of the plurality of rows as the minimum access row. In other words, if there are two rows that have been equally accessed a minimum number of times, the minimum access output circuit 33 may determine which row to output as the minimum access row based on the selection command value SC. For example, the minimum access output circuit 33 may include a plurality of input comparators, and, based on the selection command value SC input to the plurality of comparators, select one of the plurality of rows that are accessed in the smallest number of times as the minimum access row.

The control circuit 34, which receives an index value corresponding to the minimum access row from the minimum access output circuit 33, may transmit a control signal to the address buffer 32, wherein the control signal replaces a row address corresponding to the index value with an address of an access row that has been recently accessed. When there are a plurality of rows having a minimum access count among the target rows, the row-hammer refresh operation may be performed by randomly selecting any one of the plurality of rows and replacing the row with the access row that has been recently accessed.

The device interface 35 may transmit addresses of the rows adjacent to the target rows and the refresh command to the memory device 10b by receiving the row-hammer refresh command from the memory controller, and the DRAM units of the memory device 10b may perform the refresh operation on word lines corresponding to addresses of the rows adjacent to the target rows.

Figure 12:
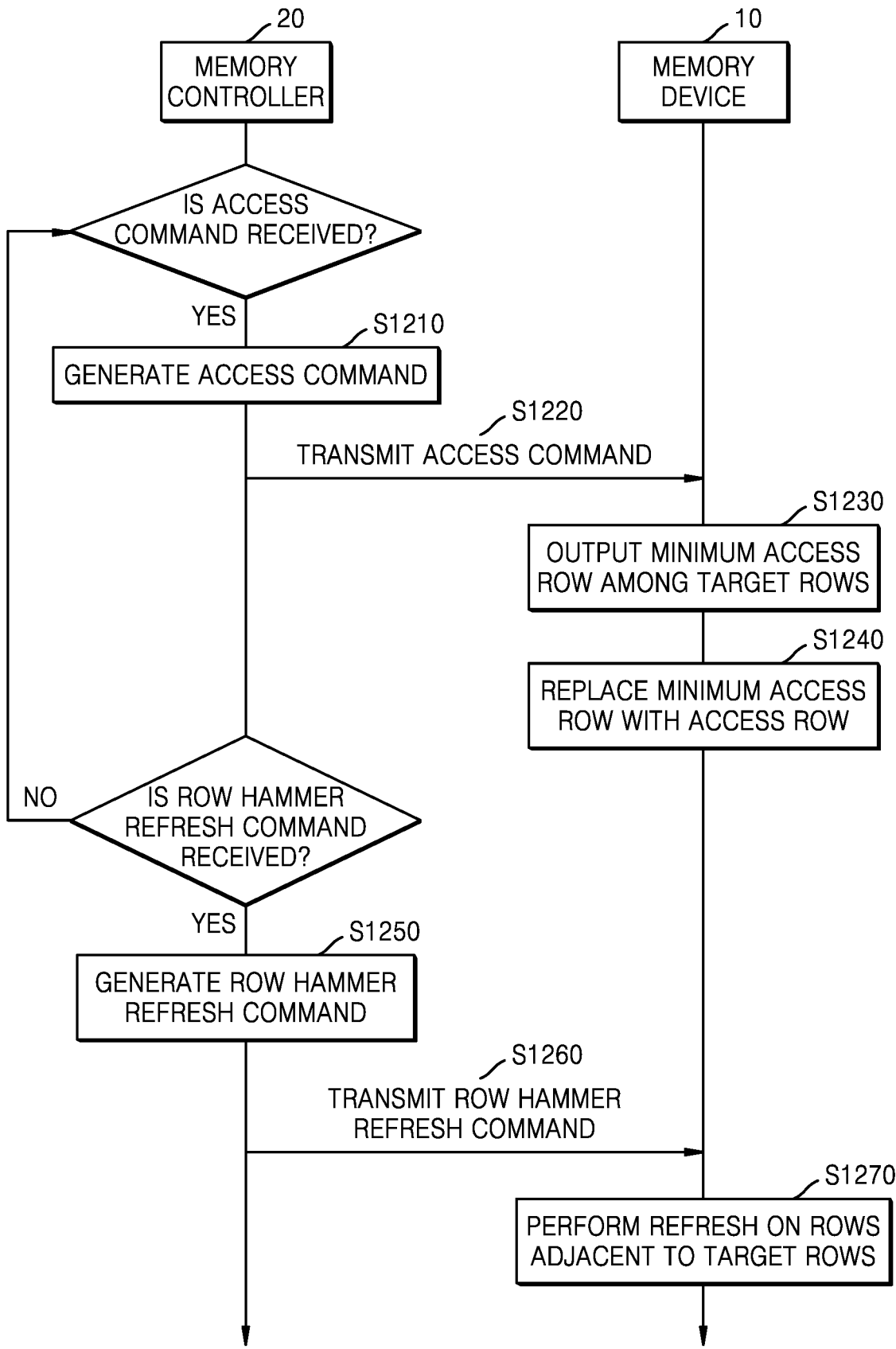
FIGS. 12 and 13 each include a flowchart of operation orders of a memory controller and a memory device according to an embodiment of the inventive concept.
Figure 13:
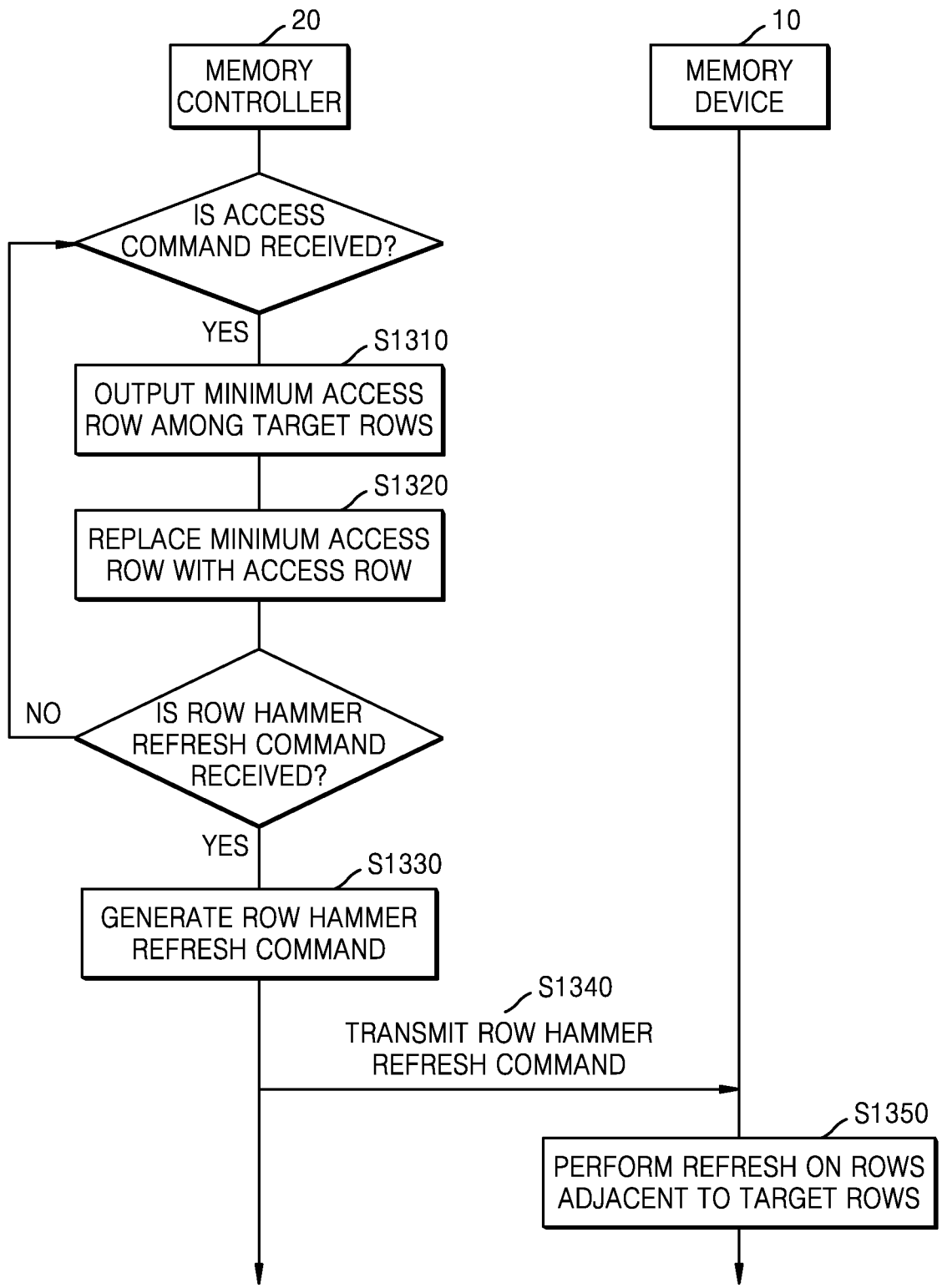

FIGS. 12 and 13 each include a flowchart of operation orders of the memory controller 20 and the memory device 10 according to an embodiment of the inventive concept.

Referring to FIG. 12, the memory device 10 may select the minimum access row among the target rows, and may update the target rows by replacing the address of the minimum access row with the address of the access row.

In operation S1210, the memory controller 20 decodes an access command provided from the host device, and may generate an access command commanding to access at least one of memory cell rows of the memory device 10. In operation S1220, the memory controller 20 may, together with the access command, transmit the row address to be accessed to the memory device 10. In other words, the access command and row address to be accessed are sent to the memory device 10 from the memory controller 20.

The memory device 10 may determine whether the access row (e.g., the row address to be accessed) is included in the target rows by comparing the row addresses to each other (e.g., comparing the row address of the access row to the row addresses of the target rows), and may replace the minimum access row among the target rows with the access row when the access row is not included in the target rows and there is no available memory room in the address buffer 12 to store the address of the access row.

In operation S1230, the memory device 10 may determine the minimum access row by comparing the access counts of the target rows to each other, and may output an index value of the minimum access row. According to an embodiment of the inventive concept, each of the plurality of input comparators 130 may receive index values and access counts of the first row and the second row among the target rows, and may output an index value and an access count of any one of the first row and the second row by comparing the access counts to each other. For example, when the access counts of the first row and the second row are identical to each other, the input comparator 130 may output any one of the first row and the second row based on the selection command value SC. The selection command value SC may be a command bit that is adaptively determined according to an internal situation of the circuit, but also may be a command bit that is randomly determined. The memory device 10 may determine the index value of the minimum access row by outputting an index value and an access count of a row that is accessed a fewer number of times.

In operation S1240, the memory device 10 may update the target rows by replacing the address of the minimum access row with the access row received to correspond to the access command. Hereinafter, the memory device 10 may update the target rows each time an access command is executed by the memory controller 20.

The memory device 10 which updated the target rows may perform a stand-by operation for performance of a next operation, and may again update the target rows in response to a case in which the memory controller 20 received the access command from the host device.

In operation S1250, the memory controller 20 may decode the row refresh command of the host device in response to a case in which the row refresh command is provided to defend a row-hammer attack from the host device, and the memory controller 20 may generate a row-hammer refresh command. In operation S1260, the memory controller may transmit the row-hammer refresh command to the memory device 10, and in operation S1270, the memory device 10 may perform the row-hammer refresh operation by performing a refresh operation on addresses of the rows adjacent to the target rows.

Referring to FIG. 13, the memory controller 20 may select the minimum access row among the target rows, and may update the target rows by replacing the address of the minimum access row with the address of the access row. The memory controller 20 may update the target rows each time the access command and the address corresponding to the access command are generated.

In operation S1310, the memory controller 20 may determine the minimum access row by comparing the access counts of the target rows, and may output an index value of the minimum access row. In operation S1320, the memory controller 20 may update the target rows by replacing the address of the minimum access row with the address of the access row corresponding to the access command. Hereinafter, the memory controller 20 may update the target rows each time an access command is generated.

In Operation S1330, the memory controller 20 may generate a row-hammer refresh command, and in operation S1340 may command performance of a refresh operation on the rows adjacent to the target rows by transmitting the row-hammer refresh command to the memory device 10. The memory controller 20 may transmit addresses of the rows adjacent to the target rows together with the row-hammer refresh command, and in operation S1350, the memory device 10 may perform the row-hammer refresh operation by performing the refresh operation on the rows adjacent to the target rows. According to an embodiment of the inventive concept, the memory controller 20 may transmit addresses of the rows adjacent to the target row together with a TRR command. In other words, the memory device 10 may perform the row-hammer refresh operation by performing a general control operation, without an additional circuit configuration or an operation of determining the minimum access row.

Embodiments of the inventive concept described above provide a target row selecting method of a memory device to prevent a row-hammer phenomenon.

While the inventive concept has been particularly shown and described with reference to embodiments thereof, it will be understood that various changes in form and details may be made thereto without departing from the spirit and scope of the inventive concept as set forth in the following claims.

What is claimed is:

1. A memory device, comprising:
a memory cell array comprising a plurality of memory cell rows;
an address buffer configured to store addresses of target rows of the plurality of memory cell rows, wherein the addresses of the target rows have been repeatedly accessed;
a minimum access output circuit configured to select, when there are a plurality of rows having a same minimum access count among the target rows, any one of the plurality of rows having the same minimum access count as a minimum access row based on a selection command value, and to output an index value of the minimum access row; and
a control circuit configured to output a command instructing replacement of an address corresponding to the index value of the minimum access row with an address of an access row and storage of the address of the access row in the address buffer.

2. The memory device of claim 1, wherein the control circuit is configured to generate the command instructing replacement of the address of the minimum access row with the address of the access row when the address buffer is full and the address of the access row, which corresponds to an access command, is not included in the addresses of the target rows.

3. The memory device of claim 1, wherein the minimum access output circuit comprises a plurality of input comparators, and
at least one of the input comparators is configured to receive an access count of a first row and an access count of a second row among the target rows and output an index value and a smallest one of the access counts of the first row and the second row.

4. The memory device of claim 3, wherein the at least one input comparator comprises:
an access comparator configured to output a result of comparing the access counts of the first row and the second row to each other; and
a first multiplexer configured to output the access count of any one of the first row and the second row based on a result of the comparing.

5. The memory device of claim 4, wherein the access comparator is configured to output a tie-break command signal as the result of comparing when the access counts of the first row and the second row are identical to each other, and
the first multiplexer is configured to output the index value of any one of the first row and the second row based on the selection command value when the tie-break command signal is received.

6. The memory device of claim 5, wherein the first multiplexer is configured to receive the selection command value that is randomly generated when the access counts of the first row and the second row are identical to each other, and to output the index value and the access count of the first row or the second row corresponding to the selection command value.

7. The memory device of claim 6, wherein the at least one input comparator comprises a random bit generator configured to output a pseudo-random bit as the selection command value based on a linear feedback shift register.

8. The memory device of claim 7, wherein the random bit generator is configured to output the selection command value when the tie-break command signal is received.

9. The memory device of claim 7, wherein the at least one input comparator further comprises a second multiplexer configured to provide the index value of any one of the first row and the second row to the first multiplexer based on the selection command value.

10. The memory device of claim 3, wherein the plurality of input comparators are connected in a binary-tree form.

11. The memory device of claim 5, wherein the first multiplexer is configured to receive the selection command value generated based on a code corresponding to a temperature value of the memory device when the access counts of the first row and the second row are identical to each other, and output the index value and the access count of the first row or the second row corresponding to the selection command value.

12. The memory device of claim 1, wherein the address buffer comprises a counter circuit configured to store an access count of each of the target rows.

13. The memory device of claim 1, further comprising an address comparator configured to output a result of comparing each of the addresses of the target rows with the address of the access row.

14. The memory device of claim 1, wherein the control circuit is configured to perform a refresh operation on rows adjacent to the target rows in response to a row-hammer refresh command.

15. A memory controller, comprising:
an address storage circuit configured to store addresses of target rows that are repeatedly accessed among a plurality of rows included in a memory device;
a minimum access output circuit configured to select, when there are a plurality of minimum access rows having a same minimum access count among the target rows, any one of the plurality of minimum access rows having the same minimum access count as a minimum access row based on a selection command value, and to output an index value of the minimum access row; and
a control circuit configured to output a command to replace an address corresponding to the index value of the minimum access row with an address of an access row and store the address of the access row in the address storage circuit.

16. The memory controller of claim 15, wherein the control circuit is configured to generate the command instructing replacement of the address of the minimum access row with the address of the access row when the address storage circuit is full and the address of the access row to be accessed is not included in the addresses of the target rows.

17. The memory controller of claim 16, further comprising a command generator configured to generate a command instructing performance of a refresh operation on rows adjacent to the target rows.

18. The memory controller of claim 15, wherein the minimum access output circuit comprises a plurality of input comparators, and
at least one of the input comparators is configured to receive an access count of a first row and an access count of a second row among the target rows and output an index value and a smallest one of the access counts of the first row and the second row.

19. The memory controller of claim 18, wherein the at least one input comparator comprises an access comparator configured to output a result of comparing access counts of the first row and the second row to each other; and
- a first multiplexer configured to output the access count of any one of the first row and the second row based on the result of the comparing.

20. A register dock driver buffer device, comprising:
- an address buffer configured to store addresses of target rows that are repeatedly accessed among a plurality of rows included in a plurality of memory devices;
- a minimum access output circuit configured to select, when there are a plurality of minimum access rows having a same minimum access count among target rows of a target memory device, any one of the minimum access rows as a minimum access row based on a selection command value, and to output an index value of the minimum access row; and
- a control circuit configured to output a command instructing replacement of an address corresponding to the index value of the minimum access row in the target memory device with an address of an access row and storage of the address of the access row in the address buffer.

* * * * *